(12) United States Patent
Krassnitzer et al.

(10) Patent No.: US 12,312,672 B2
(45) Date of Patent: May 27, 2025

(54) Al-RICH AlCrN COATING LAYERS PRODUCED BY PVD FROM METALLIC TARGETS (71) Applicant: Oerlikon Surface Solutions AG, Pfäffikon, Pfäffikon (CH)

(72) Inventors: Siegfried Krassnitzer, Feldkirch (AT); Marijana Mionic Ebersold, Dübendorf (CH)

(73) Assignee: OERLIKON SURFACE SOLUTIONS AG, PFÄFFIKON, Pfäffikon (CH)

(*) Notice: Subject to any disclaimer, the term of this patent is extended or adjusted under 35 U.S.C. 154(b) by 0 days.

(21) Appl. No.: 18/247,092

(22) PCT Filed: Sep. 30, 2021

(86) PCT No.: PCT/EP2021/077042
§ 371 (c)(1),
(2) Date: Mar. 29, 2023

(87) PCT Pub. No.: WO2022/069686
PCT Pub. Date: Apr. 7, 2022

(65) Prior Publication Data
US 2023/0374650 A1 Nov. 23, 2023

(30) Foreign Application Priority Data
Sep. 30, 2020 (DE) ............ 10 2020 005 956.2

(51) Int. Cl.
C23C 14/06 (2006.01)
C23C 14/32 (2006.01)
C23C 14/54 (2006.01)
(52) U.S. Cl.
CPC ........ *C23C 14/0641* (2013.01); *C23C 14/325* (2013.01); *C23C 14/548* (2013.01)

(58) Field of Classification Search
None
See application file for complete search history.

(56) References Cited

U.S. PATENT DOCUMENTS

| 2011/0005920 | A1* | 1/2011 | Ivanov | H01J 37/3467 |
| | | | | 204/192.12 |
| 2020/0080187 | A1 | 3/2020 | Katagiri | |

FOREIGN PATENT DOCUMENTS

WO   WO2019101919 A1   5/2019

OTHER PUBLICATIONS

International Search Report and Written Opinion issued in Application No. PCT/EP2021/077042 dated Jan. 27, 2022.
(Continued)

*Primary Examiner* — Shamim Ahmed
*Assistant Examiner* — Bradford M Gates
(74) *Attorney, Agent, or Firm* — Chrisman Gallo Tochtrop LLC

(57) ABSTRACT

A coating layer and a method for producing thereof, wherein the coating layer includes Al, Cr and N as main components according to formula $(Al_aCr_b)_xO_yC_zN_q$, where a and b are respectively the concentration of aluminium and chromium in atomic ratio considering only Al and Cr for the calculation of the element composition in the layer, whereby a+b=1 and $0 \neq a \geq 0.7$ and $0 \neq b \geq 0.2$, and where x is the sum of the concentration of Al and the concentration of Cr, and y, z and q are the concentration of oxygen, carbon and nitrogen respectively in atomic ratio considering only Al, Cr, O, C and N for the calculation of the element composition in the layer, whereby x+y+z+q=1 and $0.45 \leq x \leq 0.55$, $0 \leq y \leq 0.25$, $0 \leq z \leq 0.25$, and wherein the coating layer exhibits 90% or more of fcc cubic phase, and compressive stress of 2.5 GPa or more, preferably between 2.5 GPa and 6 GPa.

14 Claims, 10 Drawing Sheets

* E = 422 GPa
* H = 41.5 GPa
* Al 73at%

(56) References Cited

OTHER PUBLICATIONS

Willmann, et al.: "Thermal stability of Al—Cr—N hard coatings", Scripta Materialia, Jun. 1, 2006, pp. 1847-1851, vol. 54, No. 11, Elsevier, Amsterdam, NL, XP005402935.
Gilewicz, A et al.: "Influence of Chemical Composition of AlCrN Coatings on Their Mechanical, Tribological, and Corrosion Characteristics", Journal of Friction and Wear, Sep. 1, 2020, pp. 383-392, vol. 41, No. 5, Pleiades Publishing, Moscow, XP037273022.
Romero, et al.: "CrAlN coatings deposited by cathodic arc evaporation at different substrate bias", Thin Solid Films, Aug. 25, 2006, pp. 113-117, vol. 515, No. 1, Elsevier, Amsterdam, NL, XP005847308.

* cited by examiner

- E = 422 GPa
- H = 41.5 GPa
- Al 73at%

- E = 396 GPa
- H = 40.0 GPa
- Al 75at%

- E = 336 GPa
- H = 32.4 GPa
- Al 81at%

- E = 407 GPa
- H = 42.2 GPa
- Al 79at%

AlCrCN

- E = 484 GPa
- H = 48.4 GPa
- Al 78at%

AlCrON

Al-RICH AlCrN COATING LAYERS PRODUCED BY PVD FROM METALLIC TARGETS

The present invention relates to an Al-rich AlCrN coating (hereafter also simply referred to as Al-rich AlCrN coating layer or Al-rich AlCrN layer or Al-rich AlCrN film) produced by a physical vapour deposition (PVD) process from metallic targets as well as a method for producing thereof.

The present invention relates furthermore to a coating system consisting of or comprising one or more of the above mentioned inventive Al-rich AlCrN layers.

An Al-rich AlCrN coating layer according to the present invention should be understood as a coating layer consisting of aluminium (Al), chromium (Cr) and nitrogen (N) or as a coating layer comprising aluminium (Al), chromium (Cr) and nitrogen (N) as main components.

In this context, the use of the term "Al, Cr and N as main components" in the Al-rich AlCrN-based layer means in particular that the sum of the content of Al, Cr and N in the Al-rich AlCrN-based layer as concentration in atomic percentage corresponds to more than 50 at % (i.e. a value between >50 at % and 100 at %), preferably more than 75 at % (i.e. a value between >75 at % and 100 at %), more preferably equal to or more than 80 at % (i.e. a value between 80 at % and 100 at %), if all chemical elements contained in the Al-rich AlCrN-based layer are considered for the determination of the whole chemical elements composition of the Al-rich AlCrN-based layer in atomic percentage.

The term "Al-rich" in this context is used in particular for indicating that the content of aluminium (Al) in the corresponding Al-rich AlCrN-based layer is equal to or preferably more than 70 at %, if only Al and Cr are considered for the determination of a chemical elements composition in atomic percentage (i.e. Al[at %]/Cr[at %]>70/30).

STATE OF THE ART

AlCrN coating layers having Al content above 70 at.–% (in relation to Cr), exhibiting a cubic crystal structure and a columnar micro-structure are subject to numerous studies and attempts to obtain such materials especially within an industrial PVD chambers, since it is expected that these kinds of coatings would show superior wear protection compared to the coatings with lower Al-content, such as PVD based $Al_{0.7}Cr_{0.3}N$ coatings.

Therefore, there are also some publications presenting possible methods for enhancing the metastable solubility limits of Al beyond 70 at. %. However, all these until now proposed methods involving some disadvantages.

OBJECTIVE OF THE PRESENT INVENTION

An objective of the present invention is to provide an Al-rich AlCrN-based coating and a method for producing thereof, which overcome or alleviate the disadvantages of the state of the art.

The Al-rich AlCrN-based coating should preferably exhibit cubic phase, high hardness, appropriate compressive stress and a coating microstructure, which preferably allows attaining high wear resistance and improved cutting performance, if the Al-rich AlCrN coating is applied on cutting tools.

A further objective of the present invention is to provide a flexible and reliable method for producing the inventive Al-rich AlCrN-based coatings.

DESCRIPTION OF THE PRESENT INVENTION

The objectives of the present invention are achieved by providing a method for producing Al-rich AlCrN coating layers and substrates coated with a coating system consisting of one or more of these Al-rich AlCrN coating layers or comprising one or more of these Al-rich AlCrN coating layers as described below and as claimed.

The present invention relates concretely to a coating layer comprising Al, Cr and N as main components and having chemical elements composition in atomic percentage regarding these elements according to formula $(Al_aCr_b)_xO_yC_zN_q$, where a and b are respectively the concentration of aluminium and chromium in atomic ratio considering only Al and Cr for the calculation of the element composition in the layer, whereby $a+b=1$ and $0 \neq a > 0.7$ and $0 \neq b \geq 0.18$ (more specifically a is in a range $0.7 > a \leq 0.82$), and where x is the sum of the concentration of Al and the concentration of Cr, and y, z and q are the concentration of oxygen, carbon and nitrogen respectively in atomic ratio considering only Al, Cr, O, C and N for the calculation of the element composition in the layer, whereby $x+y+z+q=1$ and $0.45 \leq x \leq 0.55$, $0 \leq y \leq 0.25$, $0 \leq z \leq 0.25$, wherein:

the coating layer exhibits:
90% or more of fcc cubic phase, and
compressive stress of 2.5 GPa or more, for example between 2.5 GPa and 6 GPa.

Depending on the application a high compressive stress can be more appropriate, for such cases, for example preferably the compressive stress is between 4 and 6 GPa, as needed for coatings or part of the coatings for some applications.

Furthermore, the present invention relates concretely to a method for producing a coating layer according to claim 1 on a surface of a substrate, wherein:

the coating layer is synthesized in the interior of a vacuum coating chamber by using reactive PVD cathodic arc evaporation techniques, wherein:

nitrogen gas is introduced in the vacuum coating chamber to be used as reactive gas, at least one arc evaporation source comprising a target material operated as cathode for evaporating the target material is used, target material consists of Al and Cr or comprises Al and Cr as main components, wherein if only considering the content of Al and Cr in atomic percentage in the target material, then the ratio of Al[at %]/Cr[at %] in the target material is more then 70/30 (i.e. Al[at %]/Cr[at %]>° 70/30), the method involves a reactive deposition of aluminium chromium nitride as a result of a reaction between aluminium and chromium from the target material with nitrogen introduced in the coating chamber, the reactive deposition of aluminium chromium nitride being carried out i. at a deposition temperature from 180° C. until 600° C., preferably from 200° C. until 500° C.

ii. at a nitrogen partial pressure from 0.1 Pa until 9 Pa, preferably from 0.2 Pa until 8 Pa, more preferably from 0.6 Pa until 7.5 Pa, iii. by using a bias voltage $U_b$ in a range corresponding to $-250 \text{ V} \leq U_b \leq -30\text{V}$, preferably in a range corresponding to $-200 \text{ V} \leq U_b \leq -40\text{V}$.

Therefore, preferably the method is carried out by using one or more arc evaporation sources as they are described by Krassnitzer in PCT/EP2020/068828 (having international publication number WO 2021/001536 A1), which is hereby incorporated by reference. In this manner it is possible to conduct the reactive PVD coating process and to produce the Al-rich AlCrN coating layer (with Al content higher than 70 at % as explained above) in a manner that an arc current of for example 200 A can be applied to the target and at the same time attaining a constant discharge voltage.

The inventors have found that the combination of Al and Cr in the above mentioned ratio in the Al-rich AlCrN layer, it means Al [at %]/Cr [at %]>70/30, preferably 82/18 Al [at %]/Cr [at %]>70/30, has shown a big contribution for improvement of wear protection to tools and/or components.

Furthermore, the present invention relates to coatings systems including one or more inventive Al-rich AlCrN coating layers.

The inventive method mentioned above for producing the above the inventive Al-rich AlCrN coating layers can be also modified by using for example further targets and/or reactive gas flows in order to produce other kind of coating layers to be combined with the inventive Al-rich AlCrN coating layers in order to produce different coating systems, e.g. as multilayer and/or gradient coating systems.

Furthermore, a reactive PVD coating process by using metallic target and by simultaneous introducing $N_2$ gas into the coating PVD chamber/apparatus is very important for the hard PVD coatings with complex coating architecture/design such as nanolayers and/or multilayers part of a coating or whole coating. PVD coating solutions for hard coatings on the tools and/or components. Preferably this coating solutions should have combination of the desired coating properties, such as microstructure, texture, elastic modulus, hardness and stress with thickness which is not limited to only 50 nm or less and with versatile (not very limited) coating properties, such as one single crystal grains orientation or very limited low residual compressive stress. Specifically, this coating solution should also be able to improve properties of AlCrN with Al content of 70%, since such material systems attracts lot of attention within the PVD hard coatings and consequently to improve wear resistance of for instance tools during the cutting process.

The Al-rich AlCrN coating layers and/or coating systems according to the present invention (i.e. comprising Al-rich AlCrN coating layers according the present invention) exhibit excellent mechanical properties, and is expected to have beneficial set of properties for providing superior performance to tools and components subjected to wear and stress collective.

The above mentioned inventive $(Al_aCr_b)_xN_y$ layers exhibit preferentially the face-centered cubic structure. Importantly, the present invention describes the method to produce the inventive Al-rich AlCrN coating by a reactive physical vapour deposition (PVD) process by arcing metallic AlCr targets having more than 70 at % of Al and by simultaneous introduction $N_2$ gas into the coating PVD chamber/apparatus.

For providing a better understanding of the present invention, some Examples, Tables and Figures will be used below for describing the invention in more detail. However, these Examples, Tables and Figures should not be understood as a limitation of the present invention but only as concrete examples and/or preferred embodiments of the present invention.

The inventive examples of Al-rich AlTiN layers deposited according to the present invention, as described below, were conducted by using an cathodic arc evaporation process at a process temperature of 400° C. (in this context the term "process temperature" is used for referring in particular to the set temperature during the coating deposition process) and at the different values of nitrogen partial pressure from 0.2 Pa to 5 Pa. As Al and Cr material source AlCr targets with element composition in at % of 80Al/20Cr were used and the targets were operated as cathode by applying an arc current of 120 A to 200 A or of 100 A to 200 A, and for each example a different substrate bias voltage and pressure.

The 5 examples of such deposition process with detailed process parameters are given in Table 1.

The properties of the Al-rich AlCrN-based coatings obtained by processes given in the Examples 1 to 5 are given in FIGS. 1 to 5.

FIGURES

FIG. 1: (a) SEM fracture cross-section image of the Al-rich AlCrN coating film deposited according to the inventive Example 1, and (b) patters of as-deposited films.

FIG. 2: (a) SEM fracture cross-section image of the Al-rich AlCrN coating film deposited according to the inventive Example 2, and (b) patters of as-deposited films.

FIG. 3: (a) SEM fracture cross-section image of the Al-rich AlCrN coating film deposited according to the inventive Example 3, and (b) patters of as-deposited films.

FIG. 4: (a) SEM fracture cross-section image of the Al-rich AlCrN-based coating film deposited according to the inventive Example 4, and (b) patters of as-deposited films.

FIG. 5: (a) SEM fracture cross-section image of the Al-rich AlCrN-based coating film deposited according to the inventive Example 5, and (b) patters of as-deposited films.

FIGS. 1(a), 2(a), 3(a), 4(a) and 5(a): SEM fracture cross-section images of monolithic coatings of Al-rich AlCrN-based materials deposited in the 5 examples of process with the parameters given in the Table 1, including also Young's modulus (E), hardness (H), and Al content measured in the deposited films.

FIGS. 1(b), 2(b), 3(b), 4(b) and 5(b): XRD patterns of the as-deposited films from the 5 examples of Al-rich AlCrN-based coatings deposited by the process with the parameters given in the Table 1.

TABLE 1

| Example | Target | Temperature | Source current | N2 pressure | Bias voltage |
|---|---|---|---|---|---|
| 1 | AlCr 80/20 | 400° C. | 200 A | 5 Pa | −150 V |
| 2 | AlCr 80/20 | 400° C. | 200 A | 5 Pa | −100 V |
| 3 | AlCr 80/20 | 400° C. | 120 A | 0.2 Pa | −40 V |
| 4 | AlCr 20/20 | 400° C. | 120 A | 3.5 Pa | −150 V |
| 5 | AlCr 80/20 | 400° C. | 120 A | 3.5 Pa | −150 V |

The film structural analyses were conducted by X-ray diffraction (XRD) using a PANalytical X'Pert Pro MPD diffractometer equipped with a CuKa radiation source. The diffraction patterns were collected in Bragg-Brentano geometry. Micrographs of the film fracture cross-sections were obtained with a FEGSEM Quanta F 200 Scanning Electron Microscope (SEM).

The hardness and indentation modulus of the as-deposited samples were determined using an Ultra-Micro-Indentation System equipped with a Berkovich diamond tip. The testing procedure included normal load of 10 mN. The hardness values were evaluated according to the Oliver and Pharr method. Thereby, we assured an indentation depth of less than 10% of the coating thickness to minimize substrate interference.

FIGS. 1(a), 2(a), 3(a), 4(a) and 5(a) show SEM micrographs of the fractured cross section of the films from the examples 1 to 5 and the coating properties: elastic modulus, hardness and the Al content.

FIGS. 1(b), 2(b), 3(b), 4(b) and 5(b) show: XRD patterns of the as-deposited films from the examples 1 to 5 and those XRD-patterns suggest a face-centered cubic crystal structure for all coatings.

The inventive method enables to produce coating layers made of cubic AlCrN or mainly (at least 90%) cubic AlCrN with more than 70 at % of Al with the whole range of physical and chemical properties, like hardness, elastic modulus, texture, for the different atomic present of Al within the coating but importantly all those coatings having in common being completely or at least in 90% cubic and to have more than 70 at % of Al at the same time (when considering only Al and Cr).

The impressive possibility of producing a such broad range of Al-rich AlCrN coating layers with at least 90% cubic face is attained by the inventors in particular by conducting the inventive method in such a manner that following conditions are fulfilled:

a high N (nitrogen) ionization, meaning more than 50% of N species arriving to the substrate for coating formation are double charged is attained and maintained during coating process, and at the same time.

a high implantation of metallic species (aluminium and chromium) is attained and maintained during coating process in such a manner that a high energy of metal ions having energy more or equal to 200 eV is available.

The above mentioned conditions in the inventive process are attained by suitable combination of the process parameters, which must to be adopted to the specific PVD coating equipment in order to fulfill above given 2 conditions.

Examples of a combination of the process parameters for attaining the above mentioned coating conditions are given here below:

Group 1:

For low bias voltage, $-100V<U_b\leq-40V$, only low pressure (0.1 Pa to 1 Pa) and simultaneously higher temperatures (350° C. to 500° C.) are suitable, while Group 2:

For higher bias voltage, $-200V\leq U_b\leq-100V$ higher pressure range (0.8 Pa to 9 Pa) and simultaneously higher temperature range (200° C. to 480° C.) can be used.

Specific examples of Al-rich AlCrN-based coatings deposited by the process fulfilling the above described conditions with the specific combination of the process parameters are given in the Table 1.

In the examples 1 to 5 given in the present description PVD coaters of Oerlikon Balzers were used.

In the example 1 and 2 in the Table 1, it can be observed that the process parameters as described correspond to a suitable combination of coating parameters according to the Group 2 described above, where those parameters for T, source current and pressure are the same (400° C., 200 A and 5 Pa, respectively), but only bias voltage was changed from −150V to −100V.

Figure 1A:
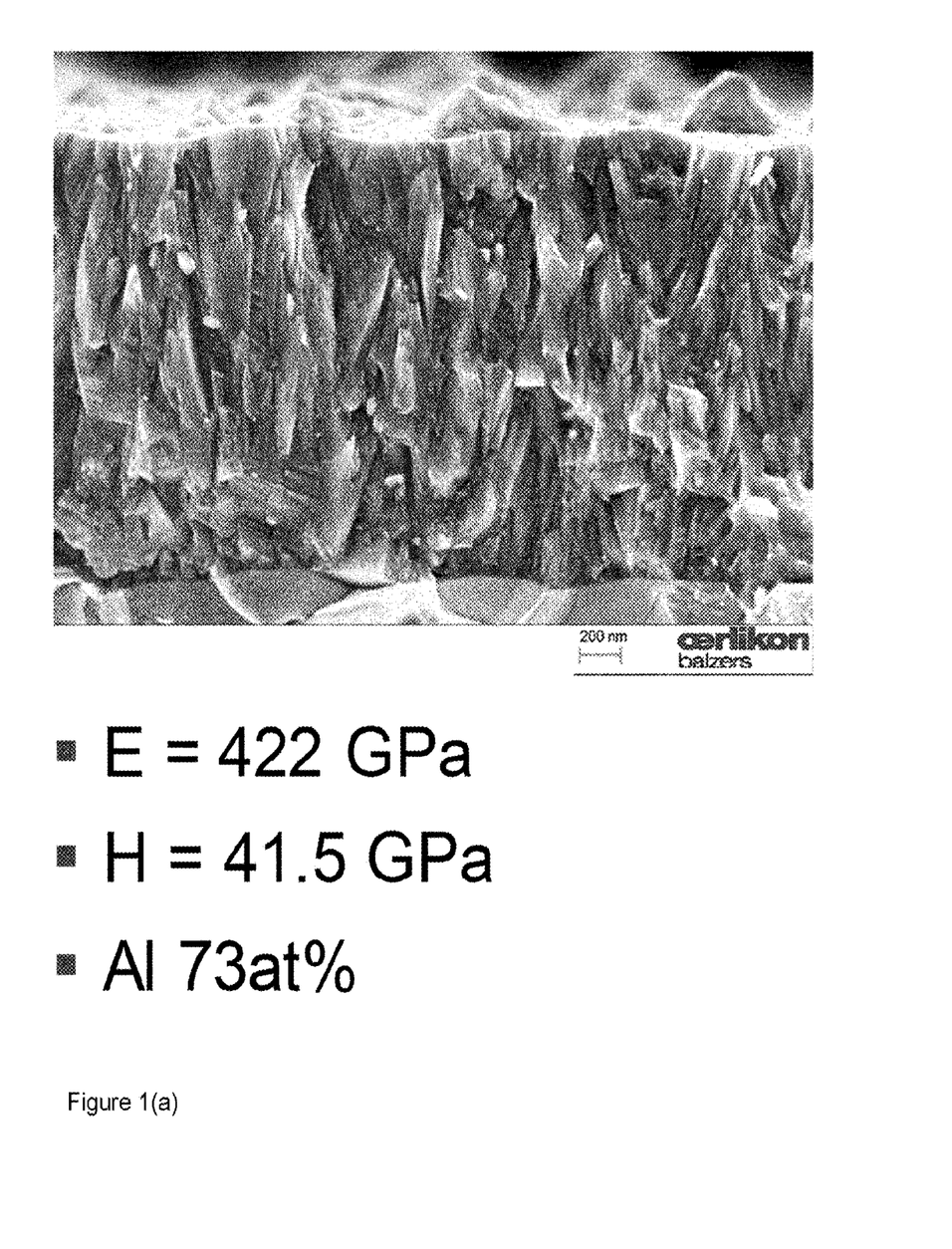
Figure 1B:
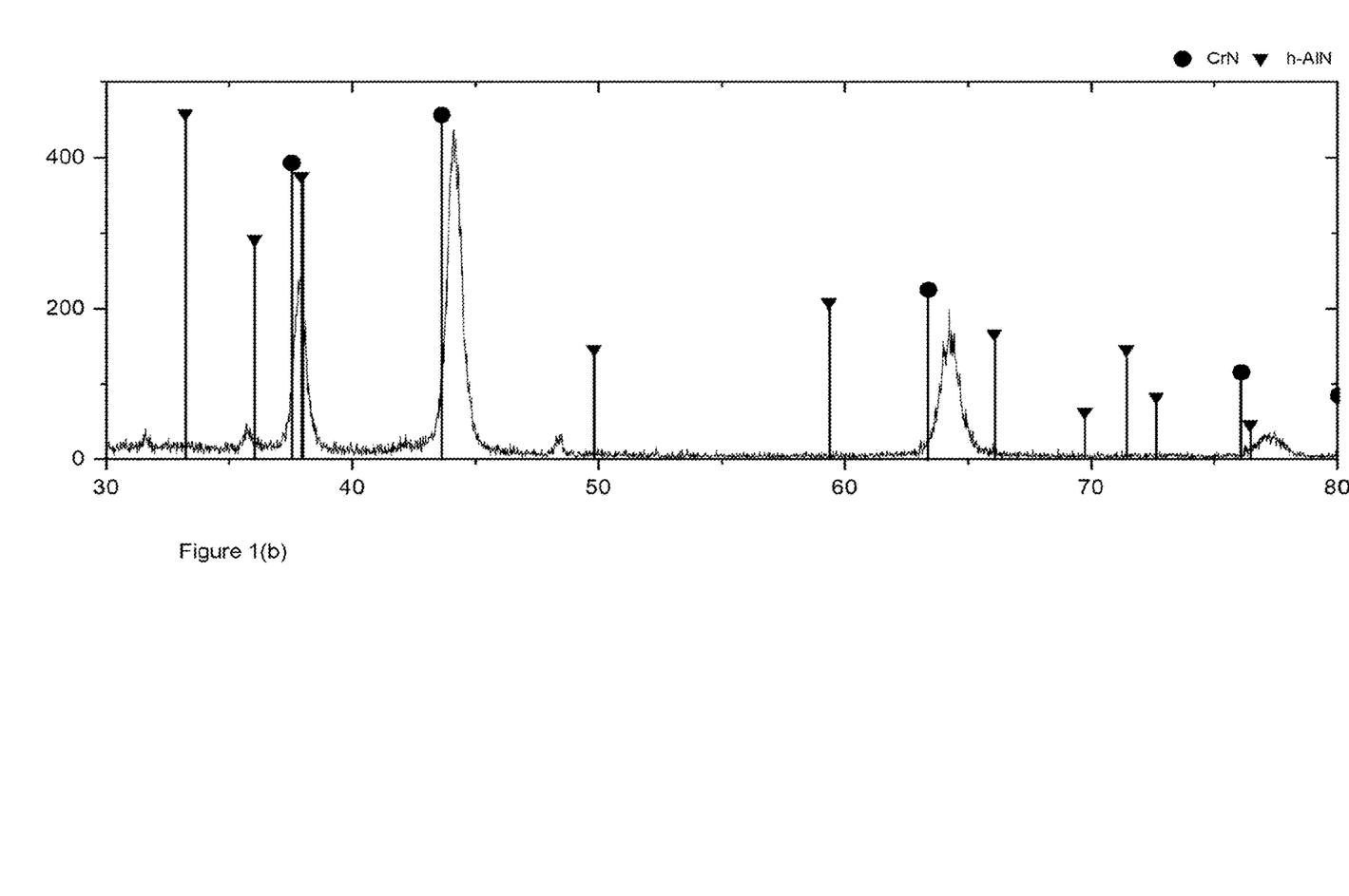
Figure 2:
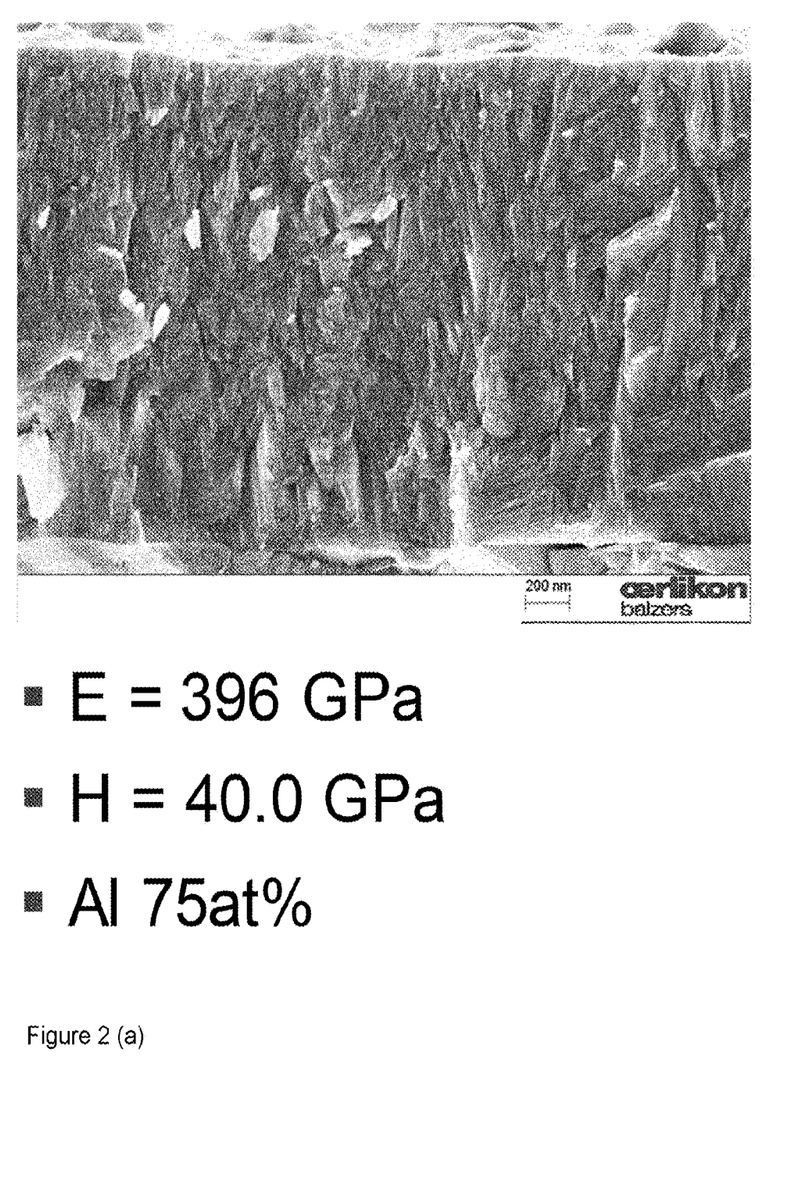
Figure 2B:
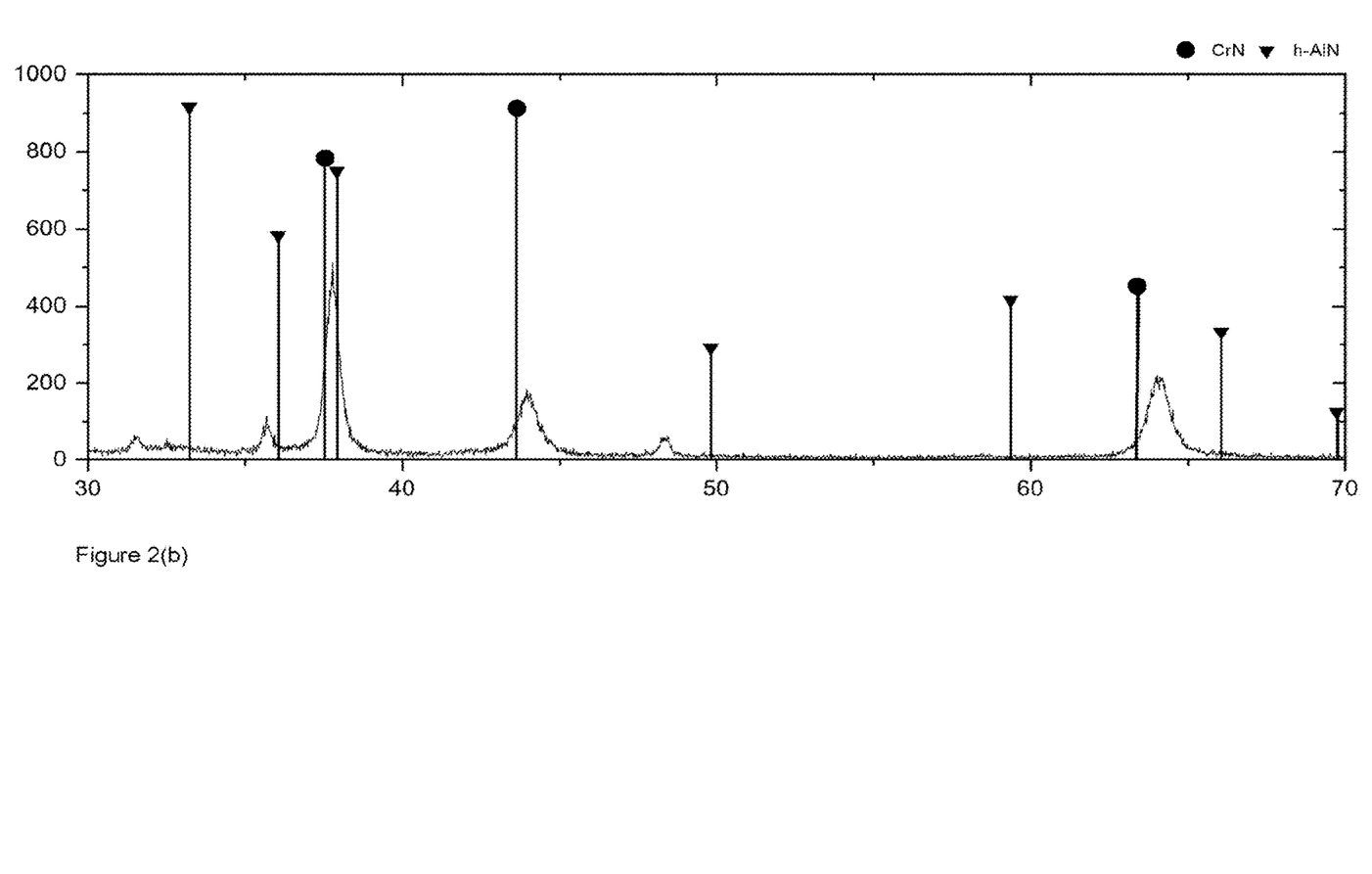

In FIGS. 1 (a,b) and 2 (a,b), are shown the essential properties of the AlCrN coatings obtained by the process given in the Example 1 and 2 by using a combination of coating parameters as indicated in the Table 1. Namely, it can be seen that in the both examples, obtained coatings are Al-rich (coatings contained 73 and 75 at % of Al, respectively), both coatings are cubic, but with different texture, E and H.

Figure 3:
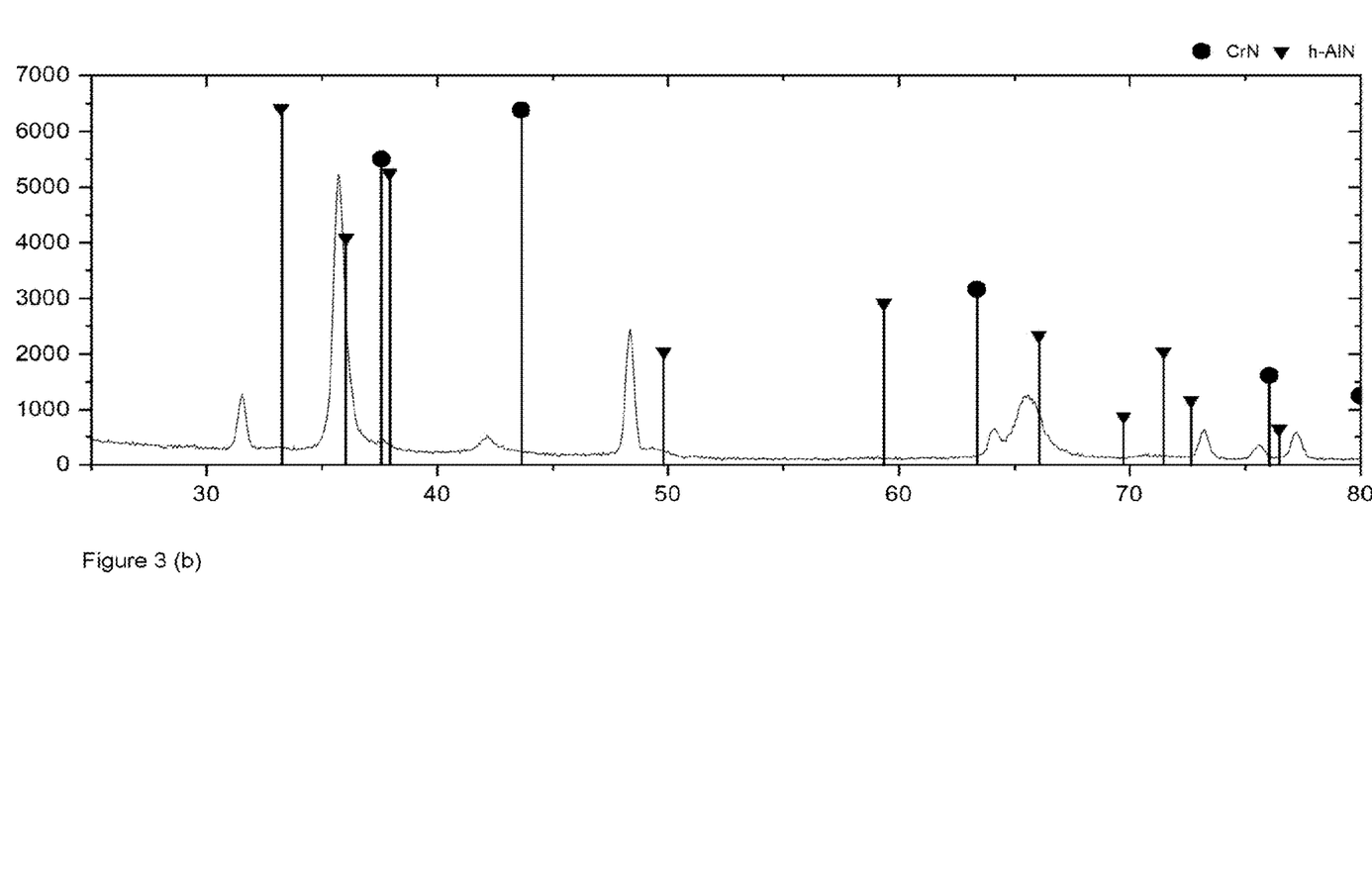
Figure 3A:
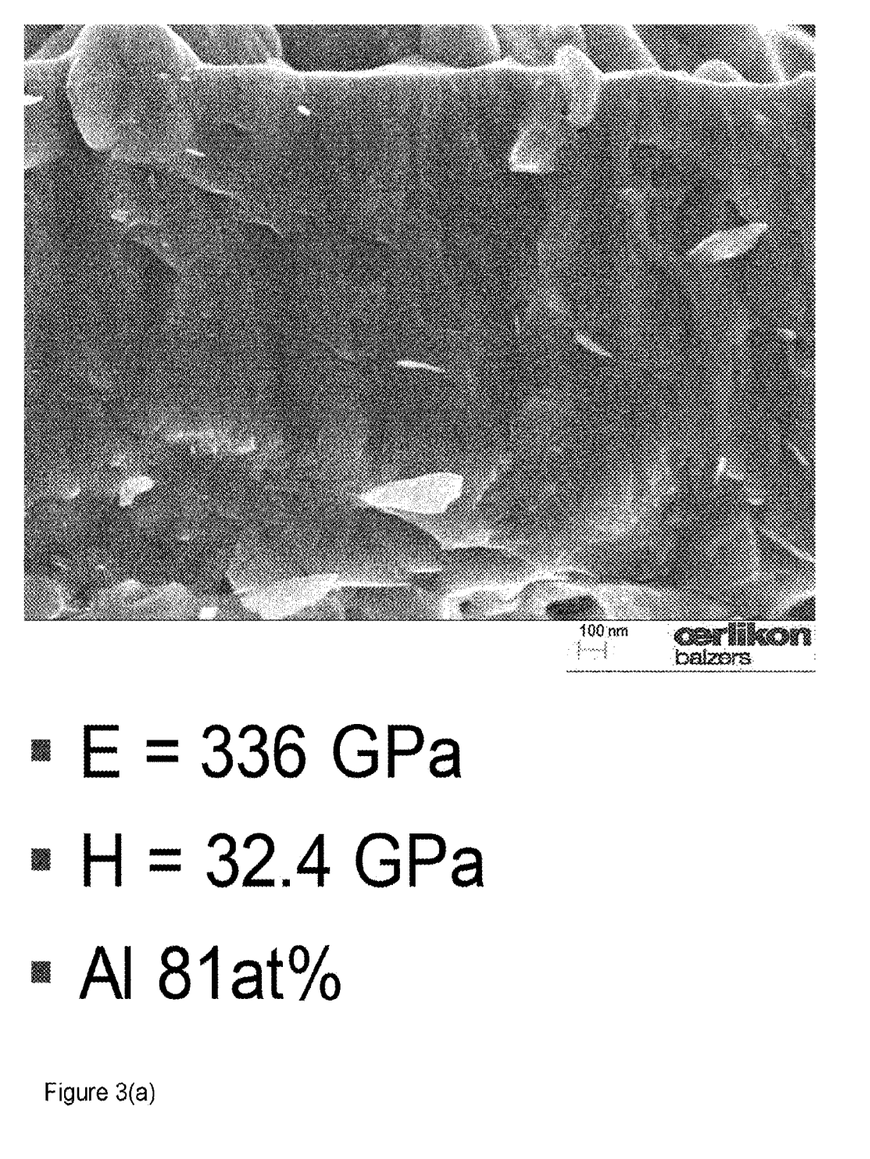
Figure 4A:
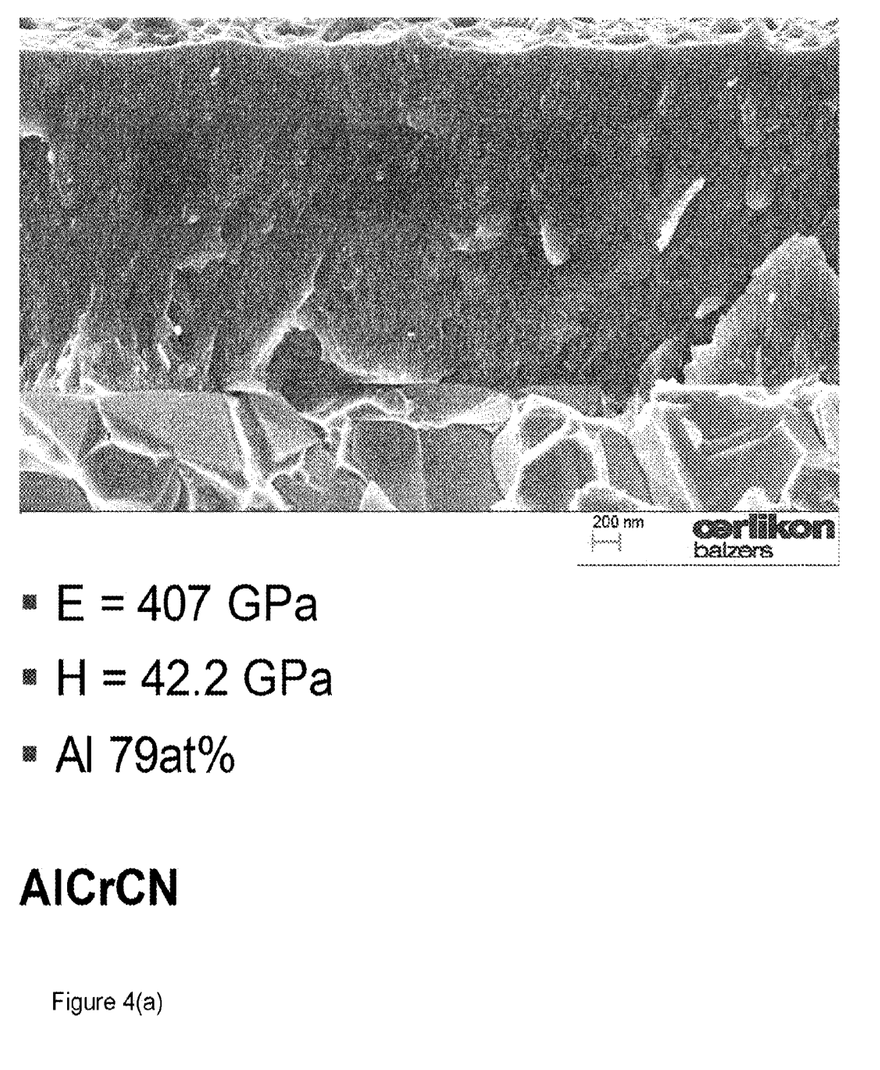
Figure 4B:
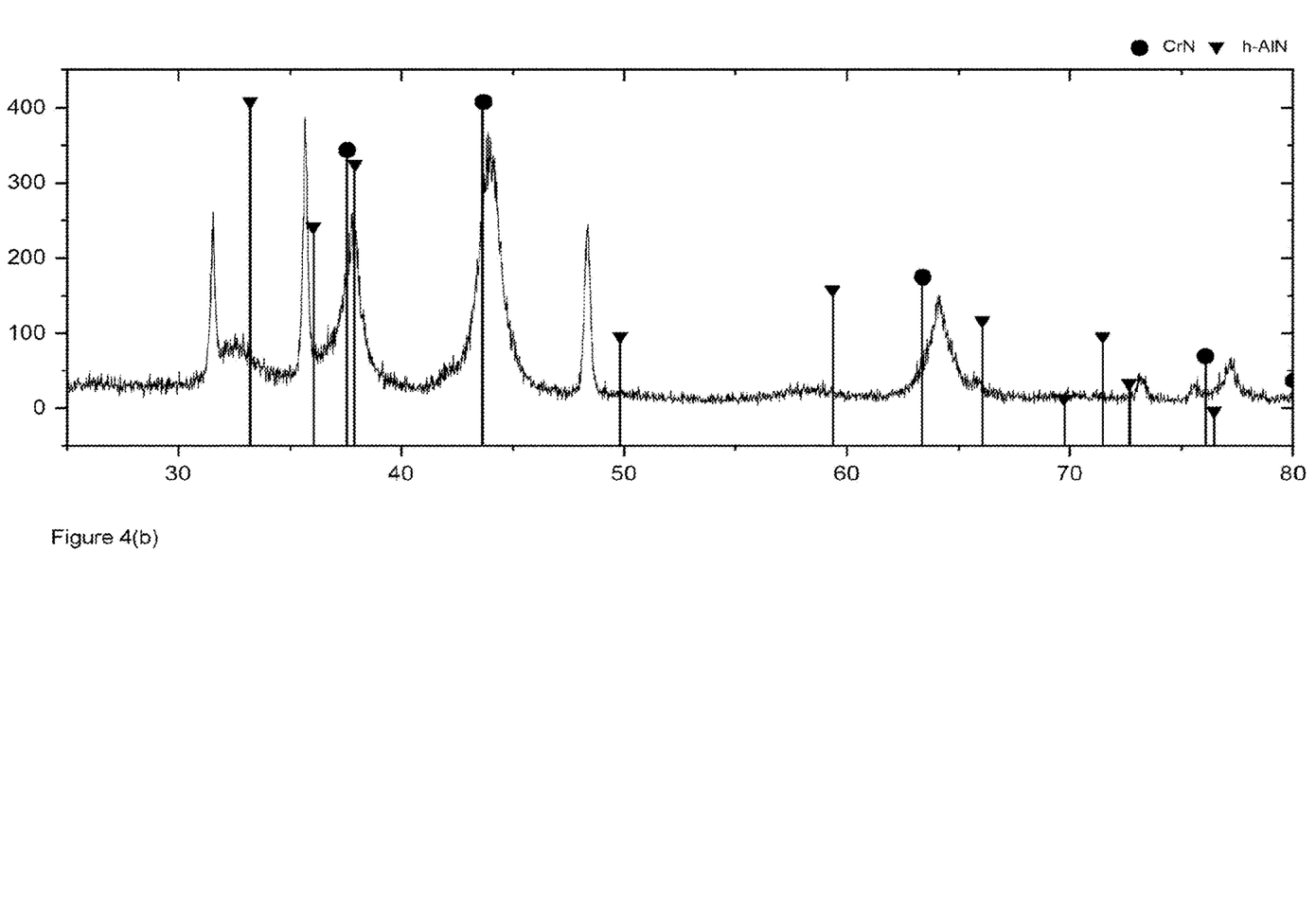
Figure 5A:
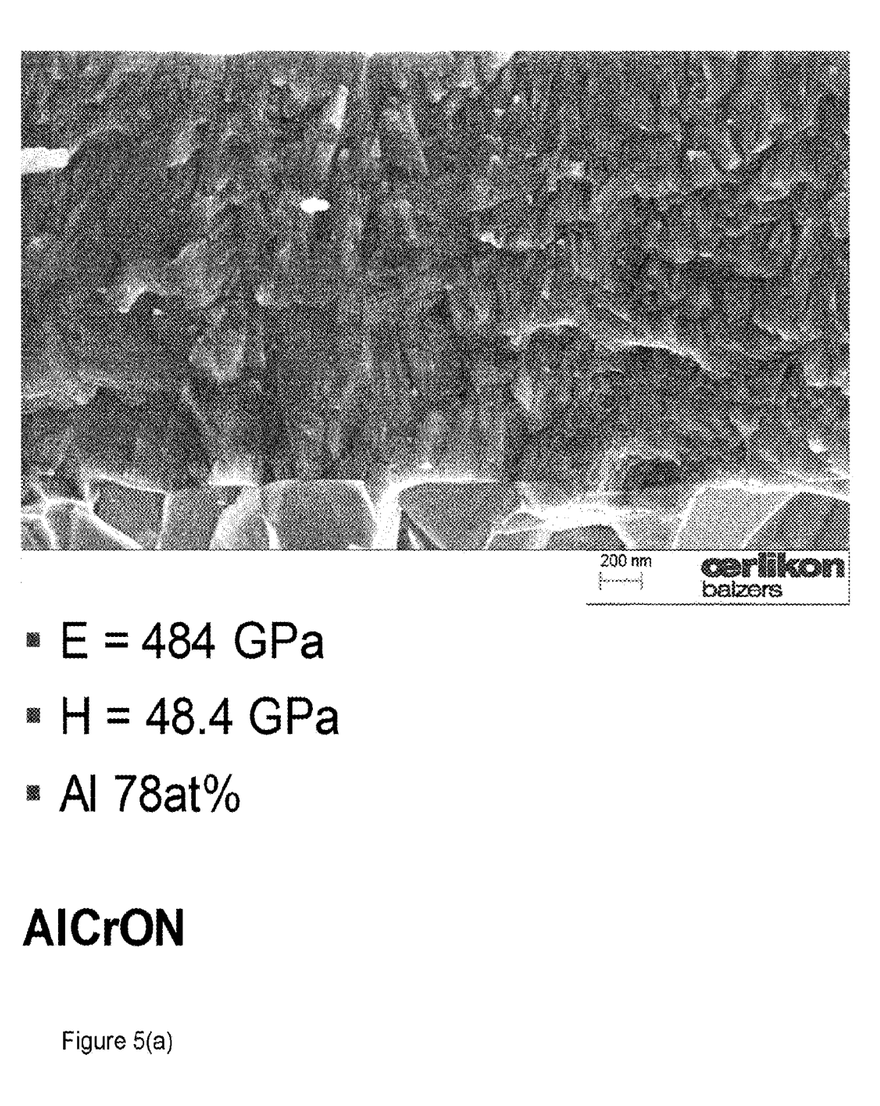
Figure 5B:
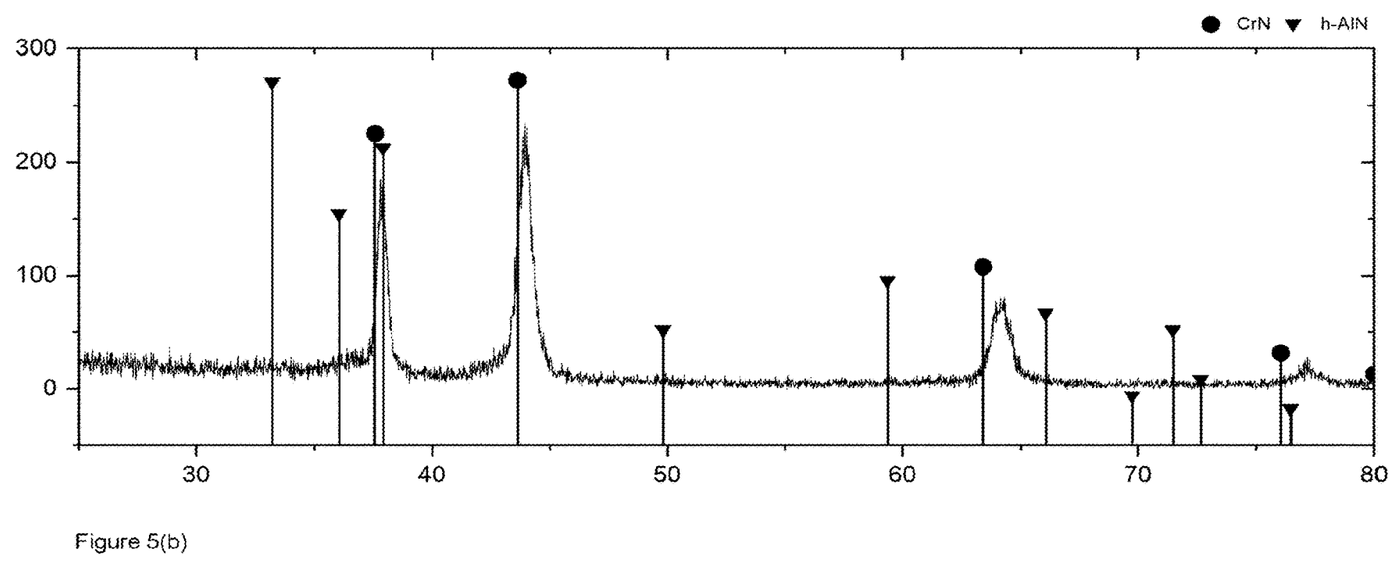

On the other hand in the example 3 given in the Table 1, example of the process parameters are given, which correspond to suitable combination of coating parameter according to the above-mentioned Group 1, where for very low bias voltage of −40V only low pressure values can be suitable (such as here given pressure of only 0.2 Pa), where such low pressure enables minimization of the collisions and retaining higher level of ionization of incoming species and in the same time high incoming flux of Al species, as reflected by very high Al content (81 at %, see FIG. 3(a)), while surprisingly still obtaining predominate cubic phase (see FIG. 3 (b)).

The plasma properties, in particular nitrogen ionization and energy of the metal ions can be measured by using Langmuir techniques.

To produce inventive Al-rich AlCrN-based film, the inventors used a reactive arc deposition process on metallic targets with more than 70 at % of Al, in which the inventive combination of the deposition parameters were selected based on the following understanding:

a) at target: Arc discharge current, distribution and strength of the magnetic field are chosen to form the desired plasma state of film forming species, consisting of single and multiple charges ions of Al, Cr, and N b) general: The combination of pressure, source current and bias voltage is chosen to provide very high energy species and thus to increase the kinetic energy, thereby increasing the quench rate of incident ions at the thin film growth front. Simultaneously those process parameters were manipulated in such way to suppress the nucleation of hexagonal phase on the growth surface. Moreover the nitrogen gas pressure is sufficiently high enough to form stoichiometric AlCrN thin film.

By optimizing the abovementioned process levers of the arc deposition, nucleation of thermodynamically favoured hexagonal phase is supressed at the growth surface, and there by the metastable solubility of Al in the c-AlCrN has been raised to higher concentration with more than 70 at. % (e.g. more than 75 at. %).

Concretely the present invention relates to a method for producing a coated substrates involving deposition of at least one coating layer on a surface of a substrate, wherein:

the at least one coating layer is synthesized in the interior of a vacuum coating chamber by using reactive PVD cathodic arc evaporation techniques, wherein:

nitrogen gas is introduced in the vacuum coating chamber to be used as reactive gas, at least one arc evaporation source comprising a target material operated as cathode for evaporating the target material is used, the target material consisting of Al and Cr or comprises Al and Cr as main components, wherein if only considering the content of Al and Cr in atomic percentage in the target material, then the ratio of Al[at %]/Cr[at %] in the target material is more than 70/30, preferably 70/30<Al[at. %]/Cr[at. %]≤90/10, the method involve a reactive deposition of aluminium chromium nitride as a result of a reaction between aluminium and chromium from the target material with nitrogen comprised in the coating chamber, the reactive deposition of aluminium chromium nitride being carried out i. at a deposition temperature from 180° C. until 600° C., preferably from 200° C. until 500° C., ii. at a nitrogen partial pressure from 0.1 Pa until 9 Pa, preferably from 0.2 Pa until 8 Pa, more preferably from 0.6 Pa until 7.5 Pa, iii. by using a bias voltage $U_b$ in a range corresponding to $-250\ V \leq U_b \leq -30V$, preferably in a range corresponding to $-200\ V \leq U_b \leq -40V$, iv. the coating layer being formed:
   a. comprising Al, Cr and N as solely components or as main components and having chemical elements composition in atomic percentage regarding these elements according to formula $(Al_aCr_b)_xO_yC_zN_q$, where a and b are respectively the concentration of aluminium and chromium in atomic ratio considering only Al and Cr for the calculation of the element composition in the layer, whereby a+b=1 and $82 \geq a \geq > 0.7$ and $0 \neq b \geq 0.18$, and where x is the sum of the concentration of Al and the concentration of Cr, and y, z and q are the concentration of oxygen, carbon and nitrogen respectively in atomic ratio considering only Al, Cr, O, C and N for the calculation of the element composition in the layer, whereby x+y+z+q=1 and $0.45 \leq x \leq 0.55$, $0 \leq y \leq 0.25$, $0 \leq z \leq 0.25$,
   b. exhibiting 90% or more of fcc cubic phase, and
   c. compressive stress of 2.5 GPa or more, preferably between 2.5 GPa and 6 GPa.

The method as mentioned above wherein:
the coating parameters are selected in such a manner that:
   i. a high nitrogen ionization is attained and maintained during deposition of the at least one coating layer in such a manner that more than 50% of the nitrogen species arriving the substrate are doble charged,
   ii. High implantation of the metallic aluminium and chromium species are enabled by attaining a high energy of the metal ions of aluminium and chromium corresponding to a value equal or higher than 200 eV.

The method as mentioned above, wherein:
the coating parameters are selected to be a combination of coating parameters being simultaneously in following ranges:
   i. bias voltage $U_b$ in a low bias voltage range of $-100\ V < U_b \leq -40\ V$,
   ii. nitrogen partial pressure in a low pressure range of 0.1 Pa up to 1 Pa, and
   iii. process temperature in a range of temperatures of 350° C. up to 500° C.
or
the coating parameters are selected to be a combination of coating parameters being simultaneously in following ranges:
   i. bias voltage $U_b$ in a high bias voltage range of $-200V \leq U_b \leq -100\ V$,
   ii. nitrogen partial pressure in a high pressure range of 0.8 Pa up to 9 Pa, and
   iii. process temperature in a range of temperatures of 200° C. up to 480° C.

The method as mentioned above, wherein that the arc evaporation source current is in a range of 120 A up to 200° C.

Coated substrate comprising a coating system comprising at least one coating layer produced according to any of the inventive method mentioned above, wherein the coating layer exhibits a hardness higher than 30 GPa, for example between 30 GPa and 50 GPa, a Young's modulus higher than 330 GPa, for example between 330 GPa and 400 GPa and aluminium content in a range between 72 at. % and 82 at. %, i.e. $0.72 \leq a \leq 0.82$.

Miscellananeous

Generally said it is intended to claim optionally—when the time may have been come—independent or additional to initially existing claims protection for a layer and or a method according to one or more (combined) paragraphs that follow hereinafter:

A coating layer comprising Al, Cr and N as main components and having chemical elements composition in atomic percentage regarding these elements according to formula $(Al_aCr_b)_xO_yC_zN_q$, where a and b are respectively the concentration of aluminium and chromium in atomic ratio considering only Al and Cr for the calculation of the element composition in the layer, whereby a+b=1 and $0 \neq a \geq 0.7$ and $0 \neq b \geq 0.2$, and where x is the sum of the concentration of Al and the concentration of Cr, and y, z and q are the concentration of oxygen, carbon and nitrogen respectively in atomic ratio considering only Al, Cr, O, C and N for the calculation of the element composition in the layer, whereby x+y+z+q=1 and $0.45 \leq x \leq 0.55$, $0 \leq y \leq 0.25$, $0 \leq z \leq 0.25$ which is inventive in that: the coating layer exhibits: 90% or more of fcc cubic phase, and compressive stress of 2.5 GPa or more, preferably between 2.5 GPa and 6 GPa.

A method for producing a coating layer according to the aforementioned paragraph on a surface of a substrate, being inventive in that the coating layer is synthesized in the interior of a vacuum coating chamber by using reactive PVD cathodic arc evaporation techniques, wherein: nitrogen gas is introduced in the vacuum coating chamber to be used as reactive gas, at least one arc evaporation source comprising a target material operated as cathode for evaporating the target material is used, target material consists of Al and Cr or comprises Al and Cr as main components, wherein if only considering the content of Al and Cr in atomic percentage in the target material, then the ratio of Al[at %]/Cr[at %] in the target material is more then 70/30, the method involve a reactive deposition of aluminium chromium nitride as a result of a reaction between aluminium and chromium from the target material with nitrogen comprised in the coating chamber, the reactive deposition of aluminium chromium nitride being carried out at a deposition temperature from 180° C. until 600° C., preferably from 200° C. until 500° C., at a nitrogen partial pressure from 0.1 Pa until 9 Pa, preferably from 0.2 Pa until 8 Pa, more preferably from 0.6 Pa until 7.5 Pa, by using a bias voltage $U_b$ in a range corresponding to $-250\ V \leq Ub \leq -30V$, preferably in a range corresponding to $-200\ V \leq Ub \leq -40V$.

What is claimed is:

1. A method for producing a coated substrates involving deposition of at least one coating layer on a surface of a substrate, wherein:

the at least one coating layer is synthesized in an interior of a vacuum coating chamber by using reactive physical vapor deposition (PVD) cathodic arc evaporation techniques, wherein:

nitrogen gas is introduced in the vacuum coating chamber to be used as reactive gas, at least one arc evaporation source comprising a target material operated as cathode for evaporating the target material is used, the target material consisting of Al and Cr or comprises Al and Cr, wherein if only considering the content of Al and Cr in atomic percentage in the target material, then the ratio of Al [at %]/Cr [at %] in the target material is more than 70/30, and is in a range of 70/30≤Al [at. %]/Cr [at. %]≥90/10, the method involve a reactive deposition of aluminium chromium nitride as a result of a reaction between aluminium and chromium from the target material with nitrogen comprised in the coating chamber, the reactive deposition of aluminium chromium nitride being carried out
  i. at a deposition temperature from 180° C. to 600° C.,
  ii. at a nitrogen partial pressure from 0.1 Pa to 9 Pa,
  iii. by using a bias voltage $U_b$ in a range corresponding $-250\ V \leq U_b \leq -30V$,
  iv. the coating layer being formed:
     a. comprising Al, Cr and N as solely components or as main components and having chemical elements composition in atomic percentage regarding these elements according to formula $(Al_aCr_b)_xO_yC_zN_q$, where a and b are respectively the concentration of aluminium and chromium in atomic ratio considering only Al and Cr for the calculation of the element composition in the layer, whereby a+b=1 and $0.82 \geq a \geq 0.7$ and $b \geq 0.18$, and where x is the sum of the concentration of Al and the concentration of Cr, and y, z and q are the concentration of oxygen, carbon and nitrogen respectively in atomic ratio considering only Al, Cr, O, C and N for the calculation of the element composition in the layer, whereby x+y+z+q=1 and $0.45 \leq x \leq 0.55$, $0 \leq y \leq 0.25$, $0 \leq z \leq 0.25$,
     b. exhibiting 90% or more of face-centered cubic phase, and
     c. compressive stress of 2.5 GPa or more,
the coating parameters are selected in such a manner that:
  i. a high nitrogen ionization is attained and maintained during deposition of the at least one coating layer in such a manner that more than 50% of the nitrogen species arriving the substrate are double charged,
  ii. an energy of the metal ions of aluminium and chromium corresponding to a value equal or higher than 200 eV,
the coating parameters are selected to be a combination of coating parameters being simultaneously in following ranges:
  i. bias voltage $U_b$ in a low bias voltage range of $-100\ V < U_b \leq -40\ V$,
  ii. nitrogen partial pressure in a low pressure range of 0.1 Pa to 1 Pa, and
  iii. process temperature in a range of temperatures of 350° C. to 500° C.

2. The method according to claim 1, wherein:
the coating parameters are selected to be a combination of coating parameters being simultaneously in following ranges:
  i. bias voltage $U_b$ in a high bias voltage range of $-200\ V \leq U_b \leq -100\ V$,
  ii. nitrogen partial pressure in a high pressure range of 0.8 Pa to 9 Pa, and
  iii. process temperature in a range of temperatures of 200° C. to 480° C.

3. The method according to claim 1, wherein the arc evaporation source current is in a range of 100 A to 200° A.

4. The method according to claim 1, wherein the coated layer has a compressive stress from 2.5 GPa to 6 GPa.

5. A coated substrate comprising a coating system comprising at least one coating layer produced according to the method of claim 1, wherein the coating layer exhibits a hardness higher than 30 GPa, a Young's modulus higher than 330 GPa, and aluminium content in a range between 70 at. % and 82 at. %.

6. The method according to claim 1, wherein the deposition temperature is from 200° C. to 500° C.

7. The method according to claim 1, wherein the nitrogen partial pressure is from 0.2 Pa to 8 Pa.

8. The method according to claim 1, wherein the nitrogen partial pressure is from 0.6 Pa to 7.5 Pa.

9. The method according to claim 1, wherein the bias voltage $U_b$ is in a range corresponding to $-200\ V \leq U_b \leq -40V$.

10. The method according to claim 1, wherein the compressive stress is between 2.5 GPa and 6 GPa.

11. The coated substrate according to claim 5, wherein the coating layer exhibits a hardness between 30 GPa and 50 GPa.

12. The coated substrate according to claim 5, wherein the coating layer exhibits a Young's modulus between 330 GPa and 490 GPa.

13. The coated substrate according to claim 5, wherein the coating layer exhibits aluminium content in a range between 72 at. % and 82 at. %.

14. The coated substrate according to claim 5, wherein the coating layer exhibits a hardness between 30 GPa and 50 GPa, a Young's modulus between 330 GPa and 490 GPa, and aluminium content in a range between 72 at. % and 82 at. %.

* * * * *